United States Patent
Chen

(10) Patent No.: US 10,270,032 B2
(45) Date of Patent: Apr. 23, 2019

(54) LIGHT SOURCE AND A MANUFACTURING METHOD THEREWITH

(71) Applicant: INT TECH CO., LTD., Hsinchu County (TW)

(72) Inventor: Chien-Yu Chen, Taoyuan (TW)

(73) Assignee: INT TECH CO., LTD., Hsinchu County (TW)

( * ) Notice: Subject to any disclaimer, the term of this patent is extended or adjusted under 35 U.S.C. 154(b) by 0 days.

(21) Appl. No.: 15/703,580

(22) Filed: Sep. 13, 2017

(65) Prior Publication Data

US 2019/0081242 A1 Mar. 14, 2019

(51) Int. Cl.
| | | |
|---|---|---|
| *H01L 51/56* | (2006.01) | |
| *H01L 51/00* | (2006.01) | |
| H01L 27/32 | (2006.01) | |
| H01L 51/52 | (2006.01) | |

(52) U.S. Cl.
CPC ...... *H01L 51/0018* (2013.01); *H01L 51/0002* (2013.01); *H01L 51/56* (2013.01); *H01L 27/323* (2013.01); *H01L 51/0097* (2013.01); *H01L 51/5206* (2013.01); *H01L 51/5221* (2013.01)

(58) Field of Classification Search
CPC . H01L 51/0018; H01L 51/0002; H01L 51/56; H01L 51/5206; H01L 51/0097; H01L 51/5221; H01L 27/323
See application file for complete search history.

(56) References Cited

U.S. PATENT DOCUMENTS

| | | | | |
|---|---|---|---|---|
| 5,580,511 A | * | 12/1996 | Sakai | ............ G03F 7/0017 |
| | | | | 257/E21.534 |
| 2005/0260349 A1 | * | 11/2005 | Pawlowski | ............ B29C 33/42 |
| | | | | 427/282 |

FOREIGN PATENT DOCUMENTS

| | | |
|---|---|---|
| TW | 201300954 A | 1/2013 |
| TW | 201611335 A | 3/2016 |
| TW | 201711125 A | 3/2017 |
| TW | 201729295 A | 8/2017 |

OTHER PUBLICATIONS

Office Action and Search Report dated Sep. 26, 2018 issued by Taiwan Intellectual Property Office for counterpart application 106142432.
English Abstract Translation of Office Action and Search Report issued by Taiwan Intellectual Property Office for counterpart application 106142432.
English Abstract Summary Translation of Foreign Reference TW201729295.

\* cited by examiner

*Primary Examiner* — Kyoung Lee
(74) *Attorney, Agent, or Firm* — WPAT, P.C., Intellectual Property Attorneys; Anthony King

(57) ABSTRACT

A method of forming a device includes emitting a coherent light beam and providing a mask including a region transparent to the light beam. The method further includes projecting the light beam on a photosensitive layer through the transparent region of the mask. The method further includes forming a recess in the photosensitive layer, wherein the recess corresponds to a position of the transparent region of the mask. The method further includes filling an organic light emitting material in the recess.

14 Claims, 25 Drawing Sheets

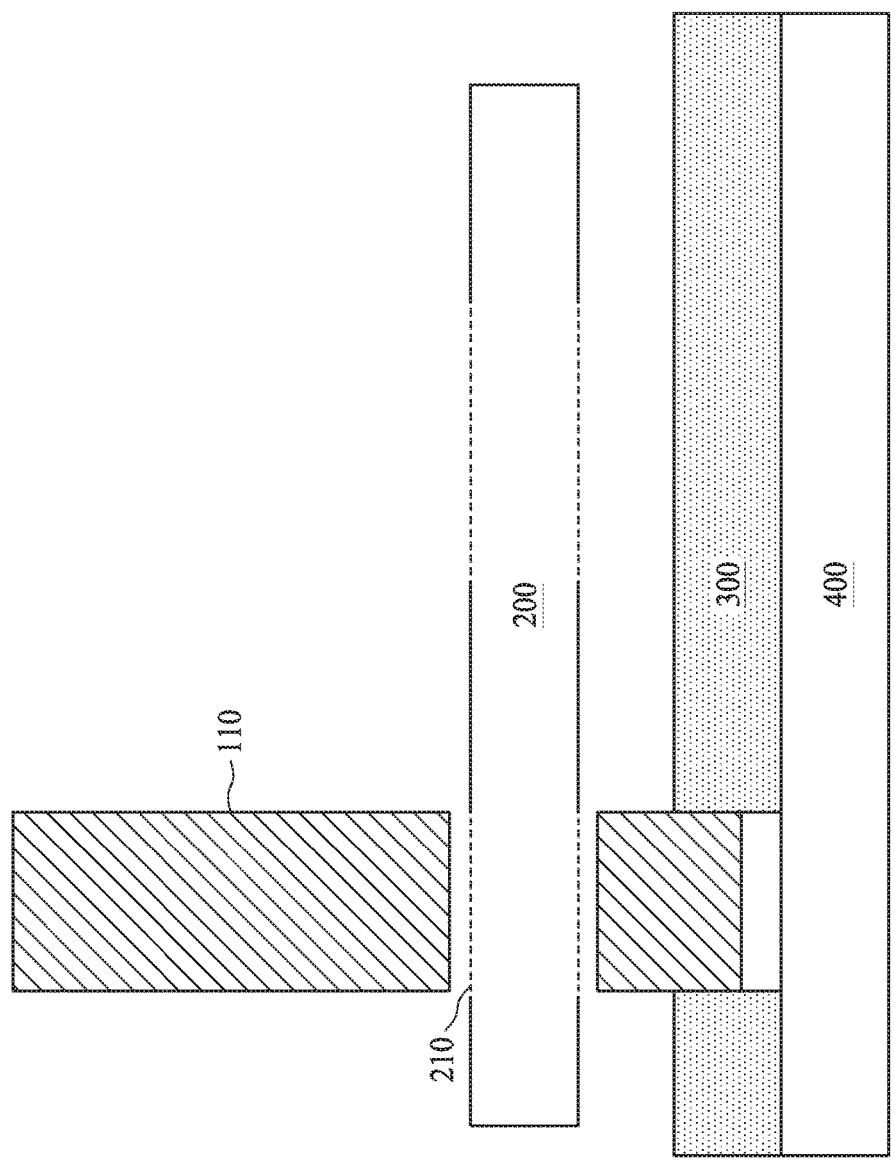

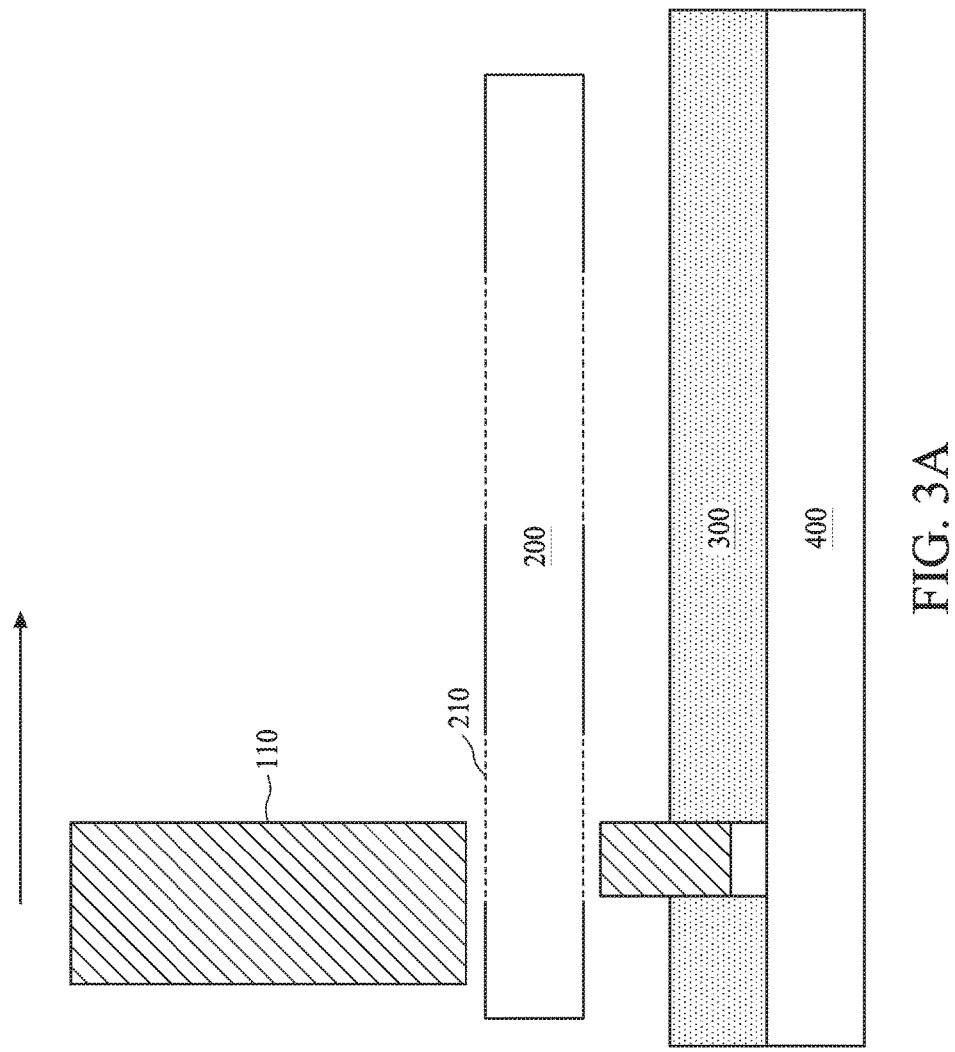

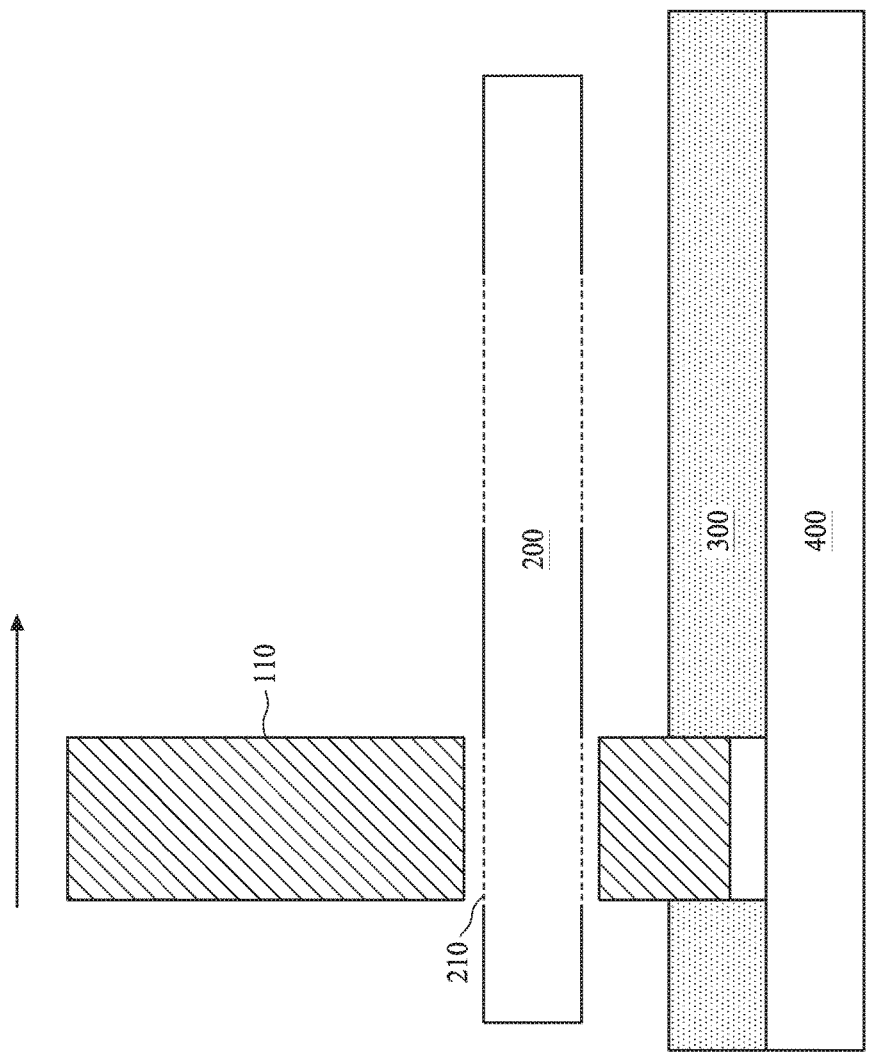

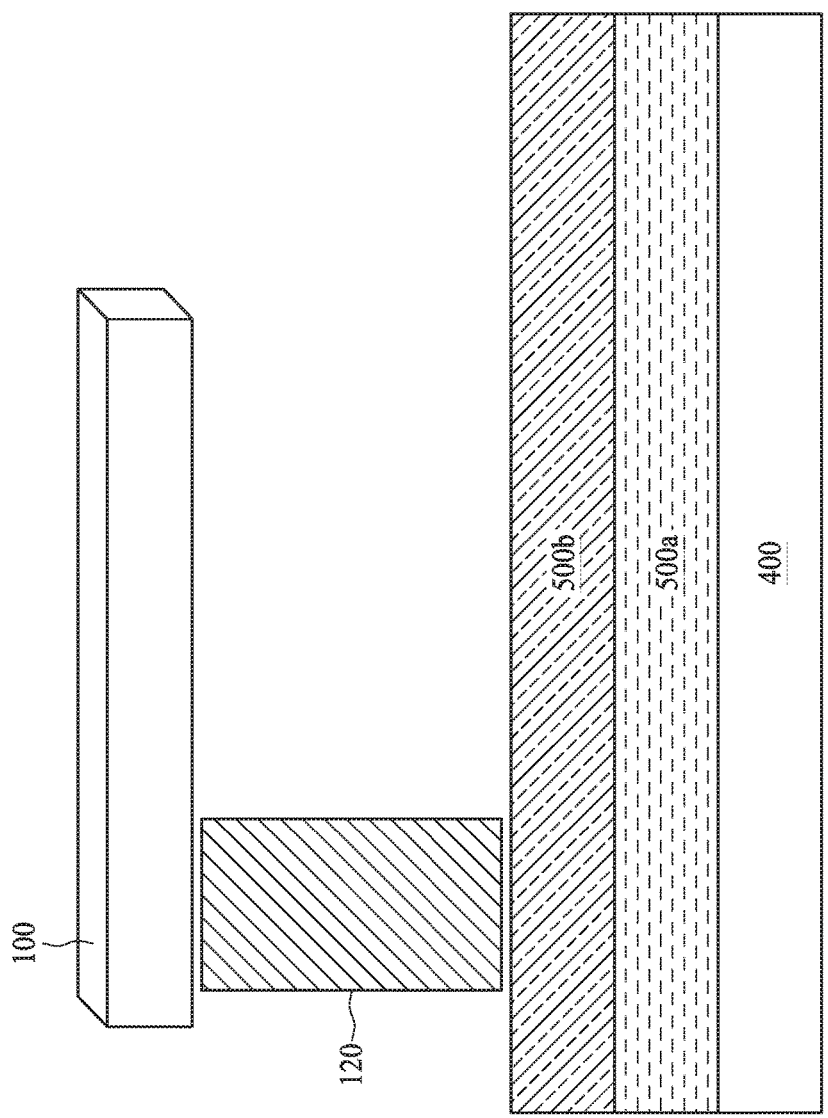

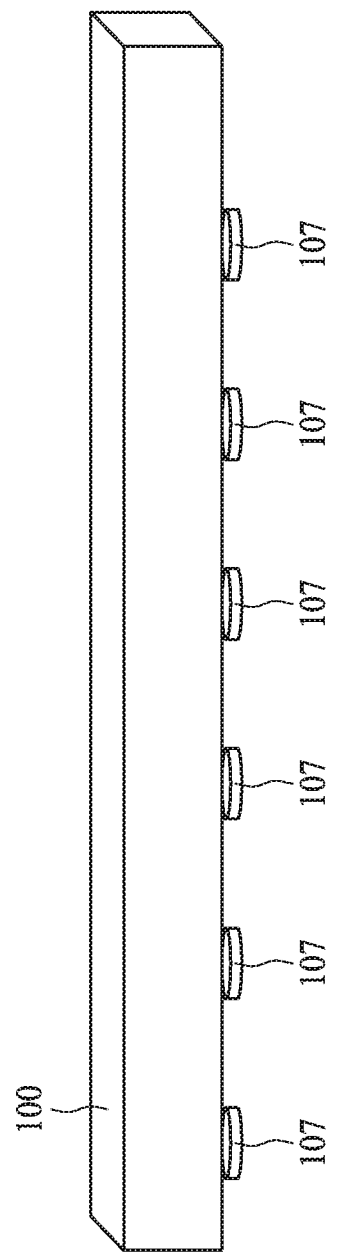

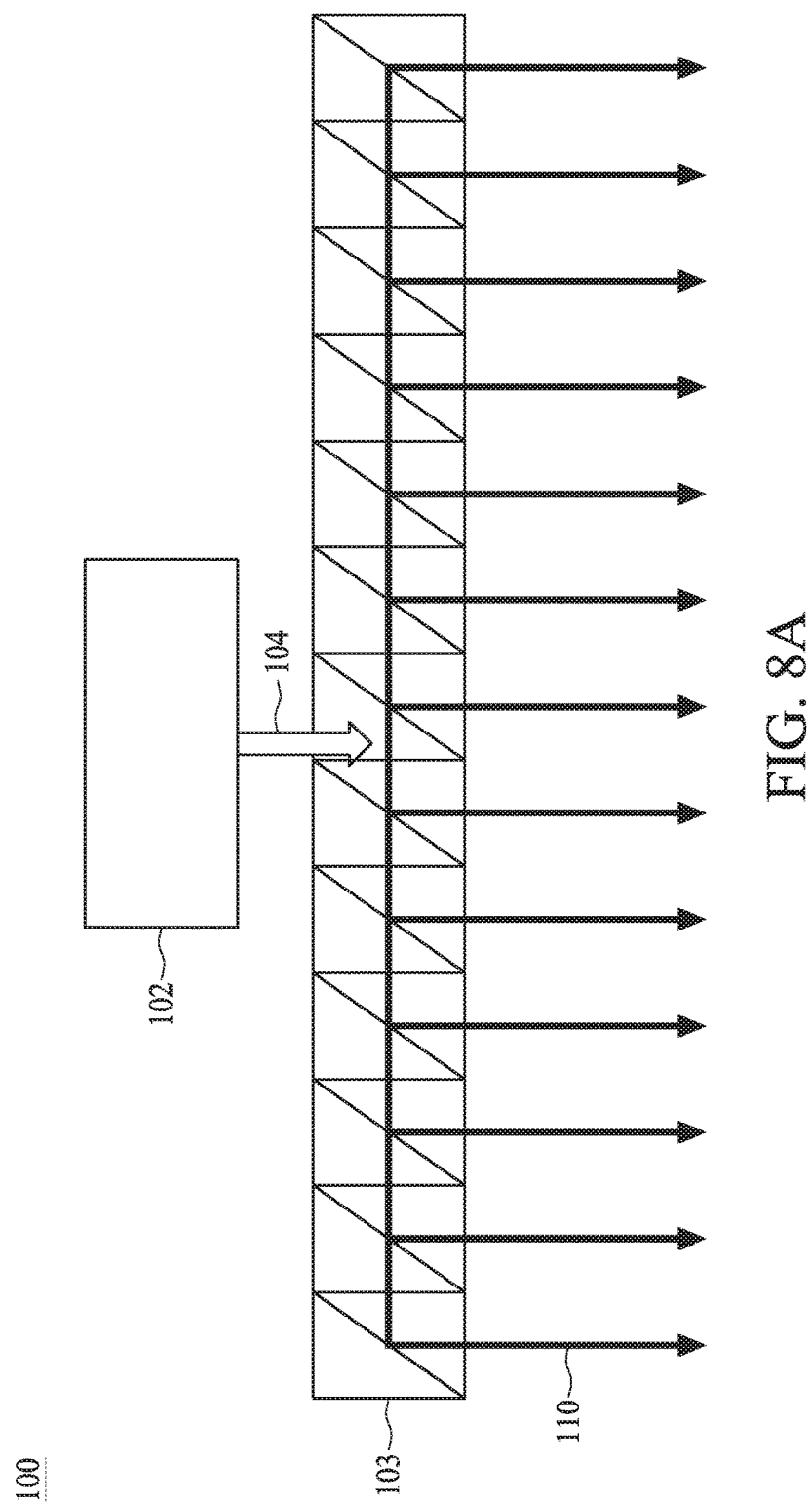

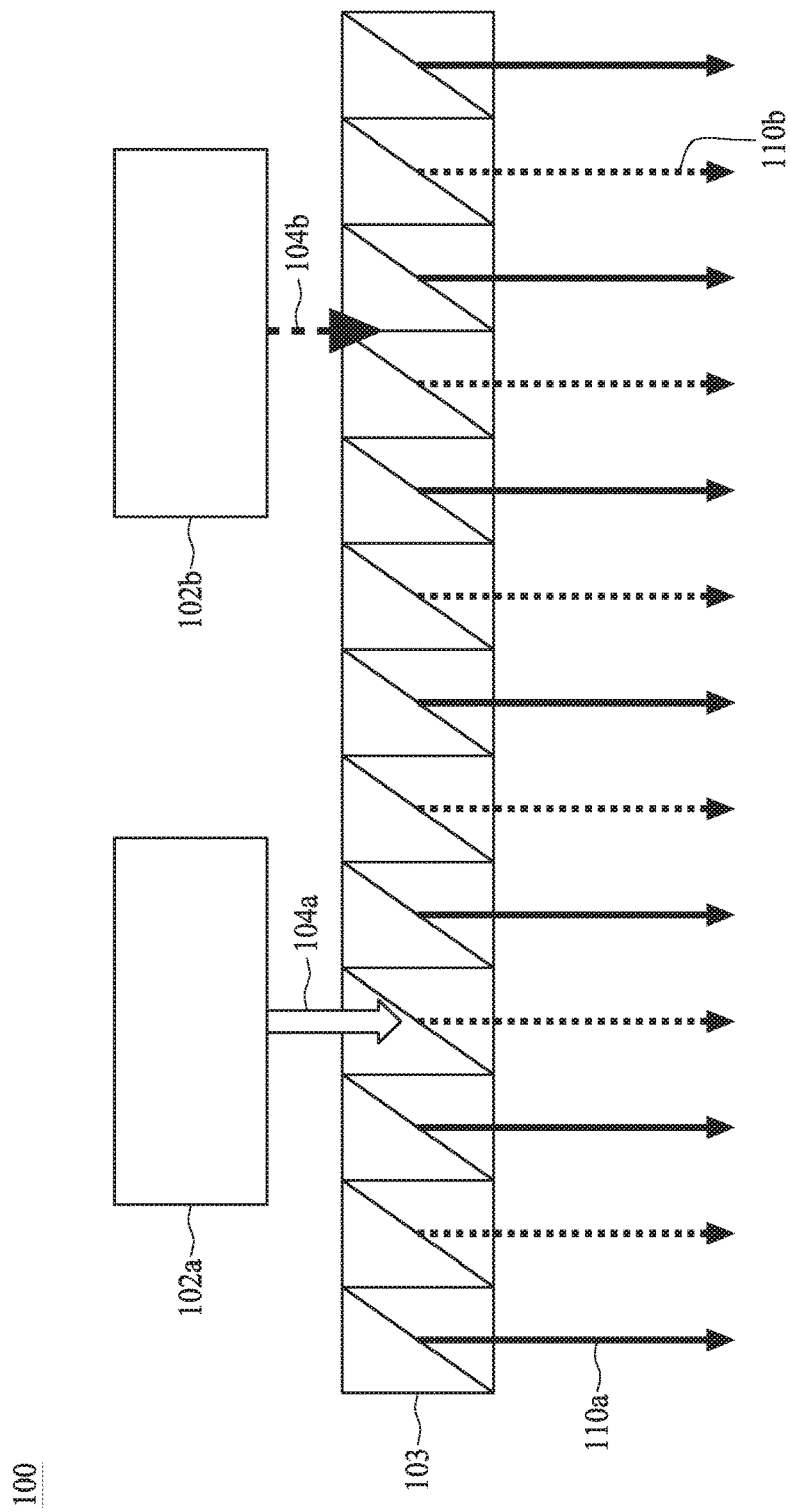

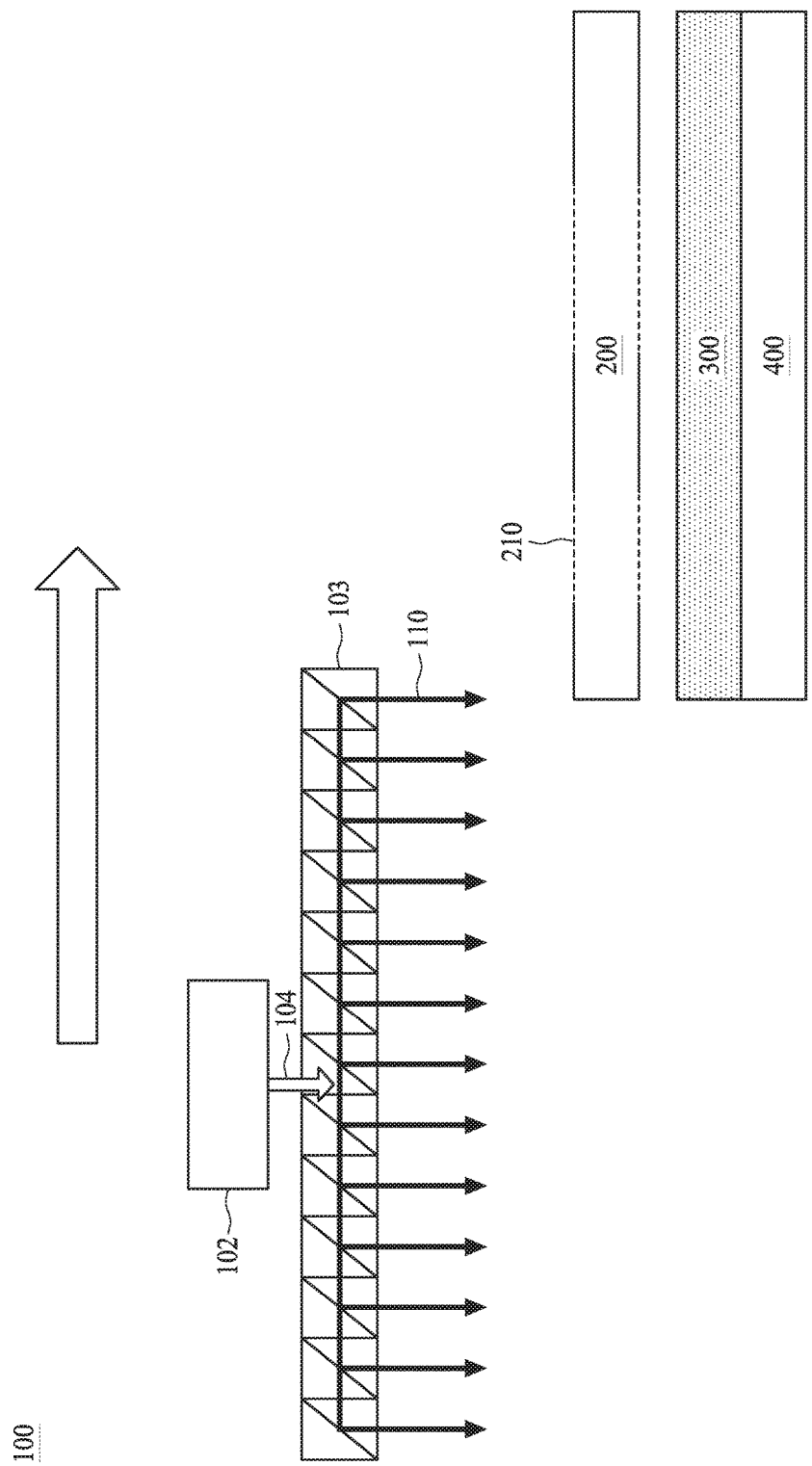

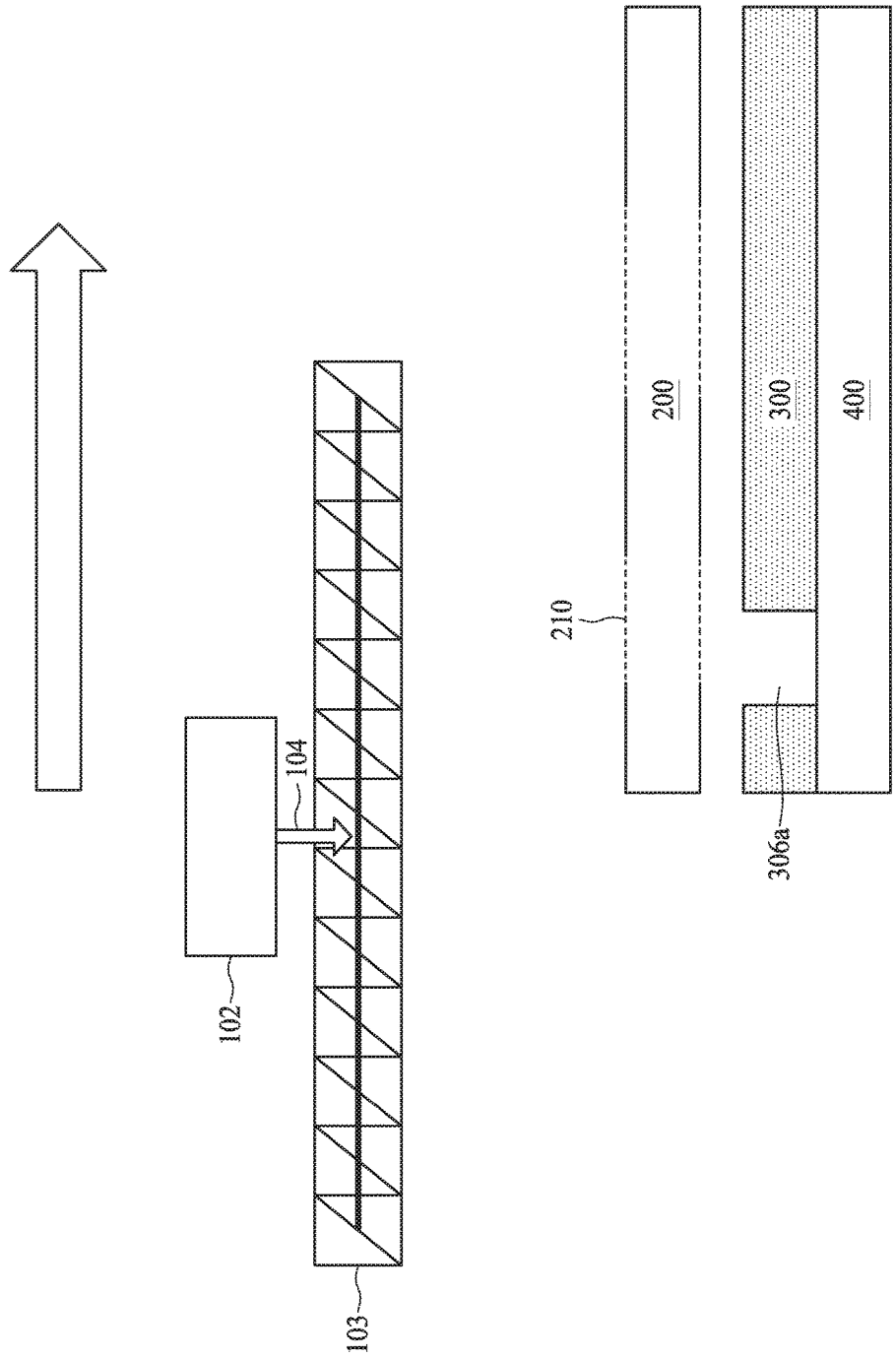

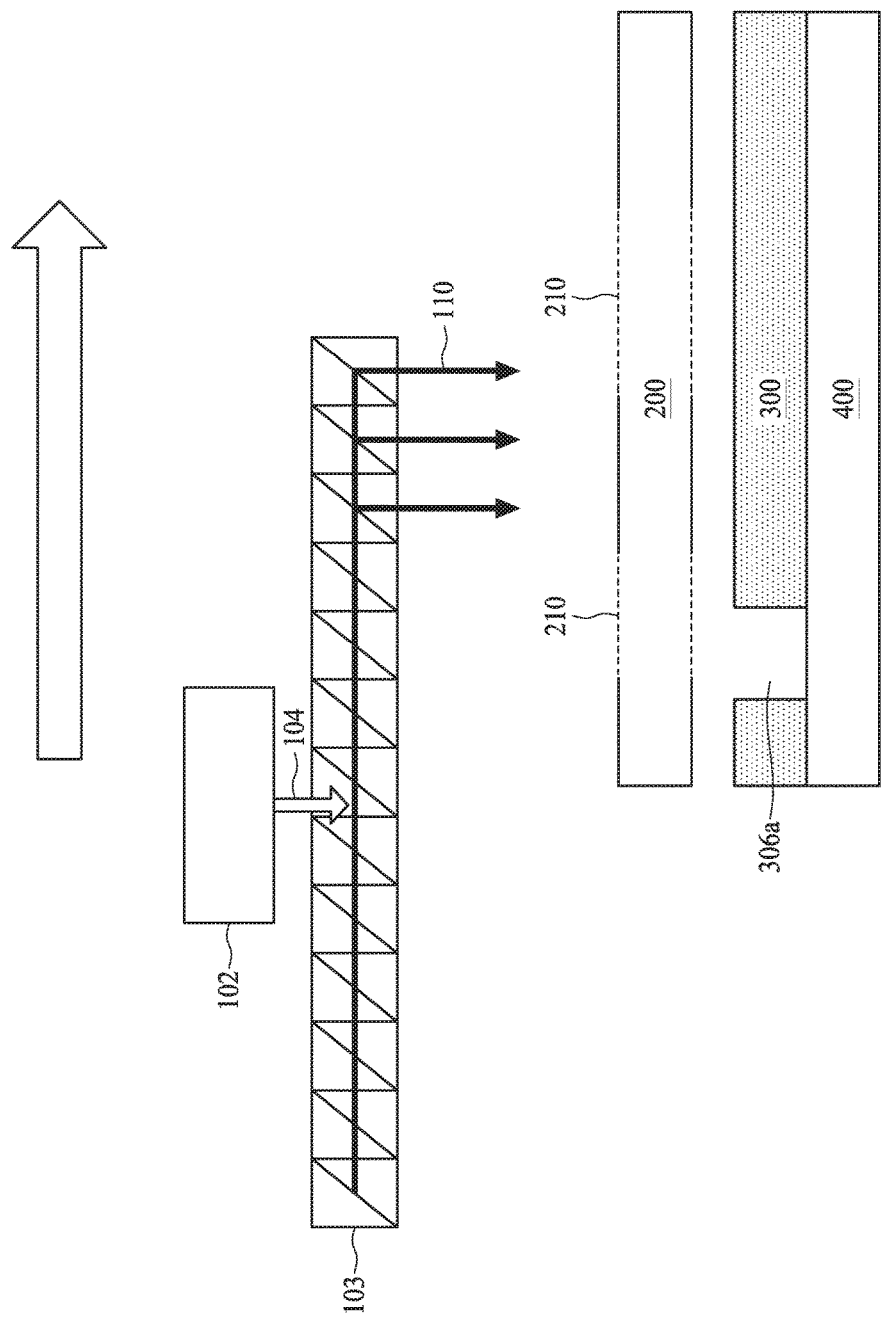

LIGHT SOURCE AND A MANUFACTURING METHOD THEREWITH

TECHNICAL FIELD

The present disclosure relates to a coherent light source designed for multiple purposes.

BACKGROUND

Light source can be used in various fields. Laser is one of the light sources been used in different industries. Lasers are distinguished from other light sources by their coherence. Spatial coherence is typically expressed through the output being a small beam, which is diffraction-limited. Laser beams can be focused to very tiny spots, achieving a very high irradiance, or they can have very low divergence in order to concentrate their power at a great distance.

SUMMARY

A method of forming a device includes emitting a coherent light beam and providing a mask including a region transparent to the light beam. The method further includes projecting the light beam on a photosensitive layer through the transparent region of the mask. The method further includes forming a recess in the photosensitive layer, wherein the recess corresponds to a position of the transparent region of the mask. The method further includes filling an organic light emitting material in the recess.

In some embodiments, the mask is a 1:1 mask and a phase difference within the light beam is less than about 1 m. In some embodiments, forming a recess in the photosensitive layer further comprising directly carving out a portion of the photosensitive layer by the light beam.

In some embodiments, the photosensitive layer is a stack including at least two different types of photo sensitive films, and projecting the light beam on a photosensitive layer through the transparent region of the mask is dependent on a type of the photosensitive layer.

In some embodiments, emitting a light beam further comprises providing a light source, wherein the light source is configured to be able to emit light beams having at least two different wavelength.

In some embodiments, the method further comprises scanning the mask prior projecting the light beam on a photosensitive layer through the transparent region of the mask.

A method of forming a device includes generating a coherent light beam from a light source and detecting a type of a first film by the light source. The method also includes electively annealing the first film by the coherent light beam in accordance with the type of the film.

In some embodiments, a phase difference within the light beam is less than about 1 m. In some embodiments, the method includes splitting the coherent light beam into a plurality of light beams prior to selectively annealing the first film.

In some embodiments, the method further comprises a second film under the first film, wherein the second film is transparent to the coherent light beam. In some embodiments, the method further comprises a second film adjacent the first film, wherein the second film is transparent to the coherent light beam. In some embodiments, the method further comprises moving the first film in relative to the light source.

BRIEF DESCRIPTION OF THE DRAWINGS

FIG. 2 illustrates an operation of the method in FIG. 1.
FIG. 3A-3C illustrate a photolithography process.
FIG. 6A-6D illustrate an annealing process.
FIG. 7 illustrates a light source.
FIG. 8A-8C illustrate some examples of a light emitting apparatus.
FIG. 9A-9F illustrate some examples of a photolithography process.

DETAILED DESCRIPTION OF THE DISCLOSURE

The present disclosure provides a method and an apparatus to perform photolithography process by using a coherent light source. The present disclosure also uses a 1:1 mask and no lense (curvature lense) needed.

The present disclosure is to provide a new design of an electrode for an organic light emitting material used in a flexible panel. The electrode has a suitable dimension in order to minimize the reflection of the ambient light. Material of the electrode also has a high flexibility and low resistivity so as to make the flexible panel foldable and low power consumption. Through the present disclosure, a flat panel designer can have a much greater window to allocate the driving circuit, touch panel wires within the light emitting pixel array.

[Photolithography]

Figure 1:
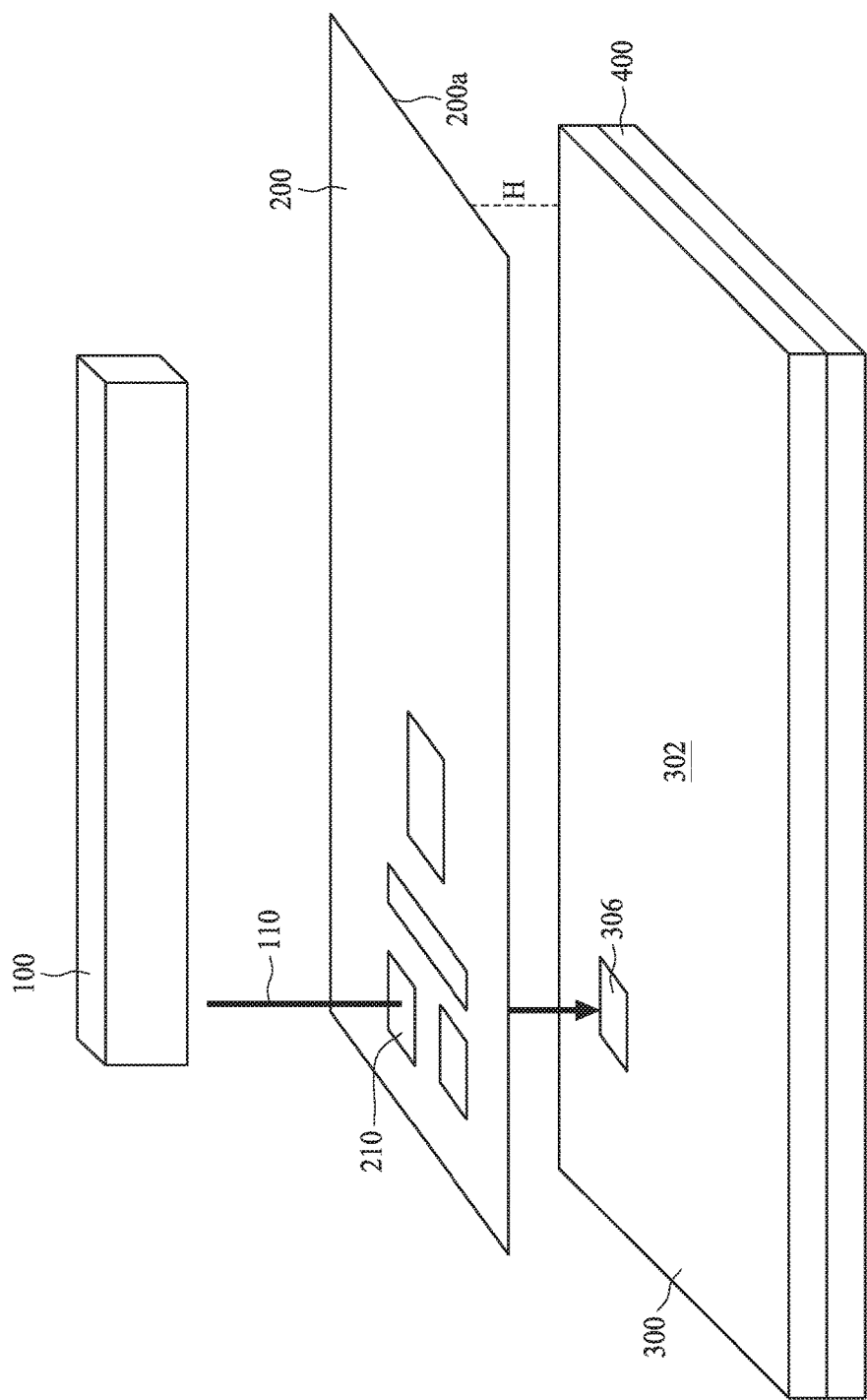
FIG. 1 illustrates a method of manufacturing a device.

FIG. 1 illustrates an embodiment of an apparatus designed for a photolithography process. The apparatus has a light source 100 to emit a light beam 110. The light beam 110 can project to a photo sensitive layer 300, which is disposed on a substrate 400 during the photolithography process. Photo mask 200 can be placed between the light source 100 and the photo sensitive layer 300.

A distance H is measured from a surface 200a of the photo mask 200 to a surface 302 of the photo sensitive layer 300. Surface 200a faces the photo sensitive layer 300 and surface 302 faces toward the photo mask 200. The distance H can be zero in some embodiments, i.e. the photo mask 200 is in touch with the photo sensitive layer 300.

Light beam 110 has a wavelength between about 300 nm and 450 nm. In some embodiments, the wave length is between about 350 nm and 390 nm. In some embodiments, the light beam 110 is more coherent than an i-line. Phase difference within the light beam is less than about 1 m. In some embodiments, the light beam is a laser. In some embodiments, the light beam is a NdYAG laser.

The photo mask 200 is made with a material that can block the light beam 110 to pass though the photo mask 200. The light beam 110 can reach the photo sensitive layer 300 via the through hole or transparent region 210 in the photo mask 210. The photo mask 200 may have several through holes with different shapes or sizes as shown in FIG. 1. The pattern of through holes of the photo mask can be projected to the photo sensitive layer 300 by the light beam 110.

Photo sensitive layer 300 can be AZ9260, AZ4562, AZ6632, AZ1518, AZ1512HS, AZ701 MR, AZ5214E, or other suitable photoresist (PR). In some embodiments, a portion 306 of the photo sensitive layer 300 is exposed to light beam 110 and vaporized by the light beam 110. When the light beam 110 projects on the photo sensitive layer 300 via the through hole 210, molecules in the portion 306 absorb the energy of the light beam 110 and then transform from a solid state to a gas state. Material filled in the portion 306 is removed and a hole or recess is formed in the photo sensitive layer 300 after exposed to light beam 110. In some embodiments, an organic light emitting material is filled into the hole or recess.

In some embodiments, the light beam 110 may change property, such as bonding (or cross linking), of the photo sensitive layer 300. The portion 306 after exposed to the light beam 110 may still stay in solid state but can be developed by a developer and transformed into a recess or a hole in the photo sensitive layer 300. In some embodiments, an organic light emitting material is filled into the hole or recess.

In some embodiments, the size of beam 110 is about 1 mm$^2$ or less. In some embodiments, if the size of hole 210 is smaller than the beam size, a one-shot exposure operation can cover the whole area of the hole 210. The whole area of the portion 306 receives the energy from the beam 110 in a same shot. If the size of hole 210 is greater than the beam size, a multiple-shot operation is needed to cover the whole area of the hole 210. The whole area of the portion 306 receives the energy from the beam 110 in multiple shots.

To perform a multiple-shot operation, there is a relative movement between the substrate 400 and the light source 100 (or light beam 110). In some embodiments, the substrate 400 is located on a movable stage. The stage is engaged with a drying system such as a step motor, magnetic trail, etc. When a multiple-shot operation is needed, the stage is moved in relative to the light beam 110 by the driving system. In some embodiments, the light source 100 is engaged with a driving system such as step motor, magnetic trail, etc. When a multiple-shot operation is needed, the light source 100 is moved in relative to the stage by the driving system. In some embodiments, a multiple-shot operation is performed though an aid of a shutter system.

FIG. 2 is a cross sectional view of a photolithography operation according to the present disclosure. In photo mask 200, the dotted lines represent regions that are transparent to the light beam 110 and solid lines represent regions that are not transparent to the light beam 110 (i.e. blocking region). In the subject example, the size of the light beam 110 is equal or greater than the size of the dotted line regions. However, this should not be deemed as a limitation.

Direct carving is used in the subject example, however, indirect carving is also suitable. As in FIG. 2, a portion of photo sensitive layer 300 under the dotted line region is directly carved by the passing light beam 110. The light beam 110 projects a 1:1 pattern from photo mask 200 to the photo sensitive layer 300. Since the size of the light beam 110 is equal or greater than the size of the dotted line regions. Alignment between the light source and the photo mask 200 can be performed to make sure the emitted light beam 110 is aligned with the dotted line region 210 prior to the exposure.

Furthermore, a continuous exposure mode is also adopted in the present disclosure. In FIG. 3A, the light source is moving toward the right side of the drawing in relative to the stage 400 and photo mask 200. At time $t_1$, a portion of light beam 110 is blocked by the solid line region of the photo mask 200, and a portion of light beam 110 passes the dotted line region 210 of the photo mask 200. A portion of the photo sensitive layer 300 is carved out by the passed light beam 110 and formed a through hole in the photo sensitive layer 300.

Figure 3B:
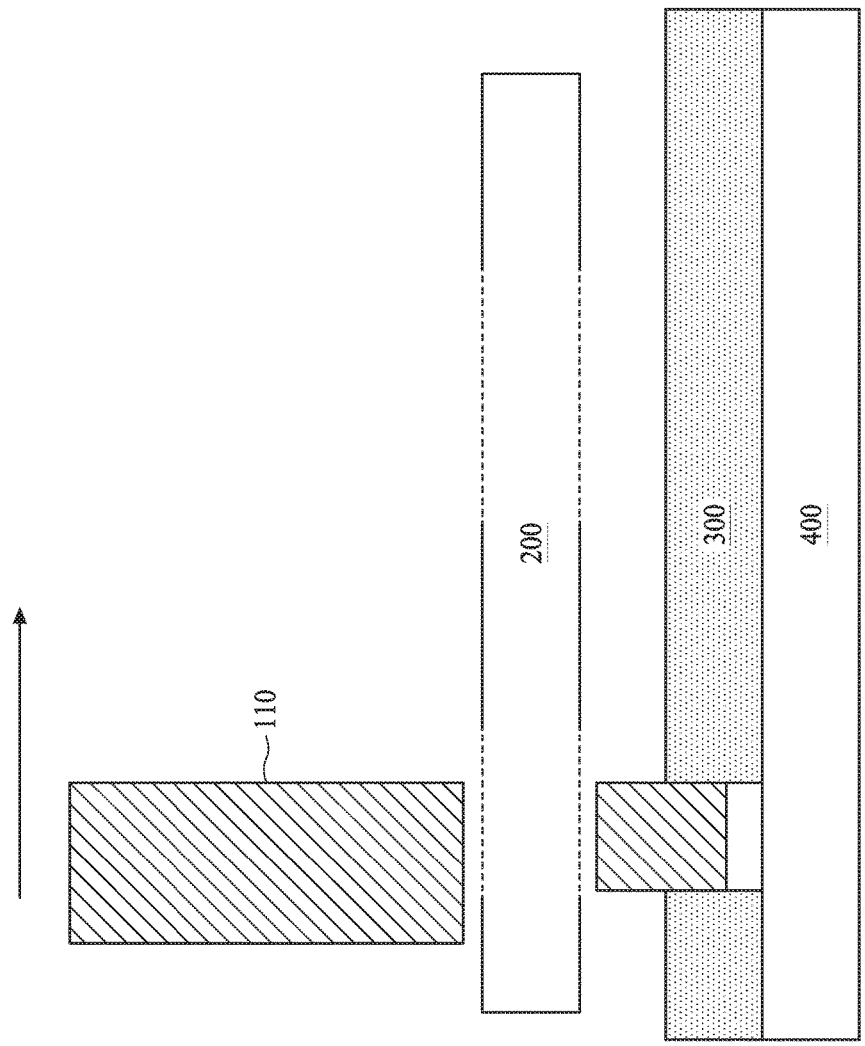

The relative motion between stage 400/photo mask 200 and the light beam continues. In FIG. 3B, at time $t_2$, there is still a portion of light beam 110 being blocked by the solid line region of the photo mask 200, and a portion of light beam 110 passed the dotted line region 210 of the photo mask 200. A further portion of the photo sensitive layer 300 is carved out by the passed light beam 110 and formed a through hole in the photo sensitive layer 300. The though hole in the photo sensitive layer 300 is enlarged.

The relative motion between stage 400/photo mask 200 and the light beam continues. When at time $t_3$, as shown in FIG. 3C, the dotted line region 210 is fully covered by the light beam 110. The shape and size (width, or 2-dimensional size) of the dotted line region 210 is 1:1 projected to the photo sensitive layer 300 and formed a through hole in the photo sensitive layer 300.

Figure 4A:
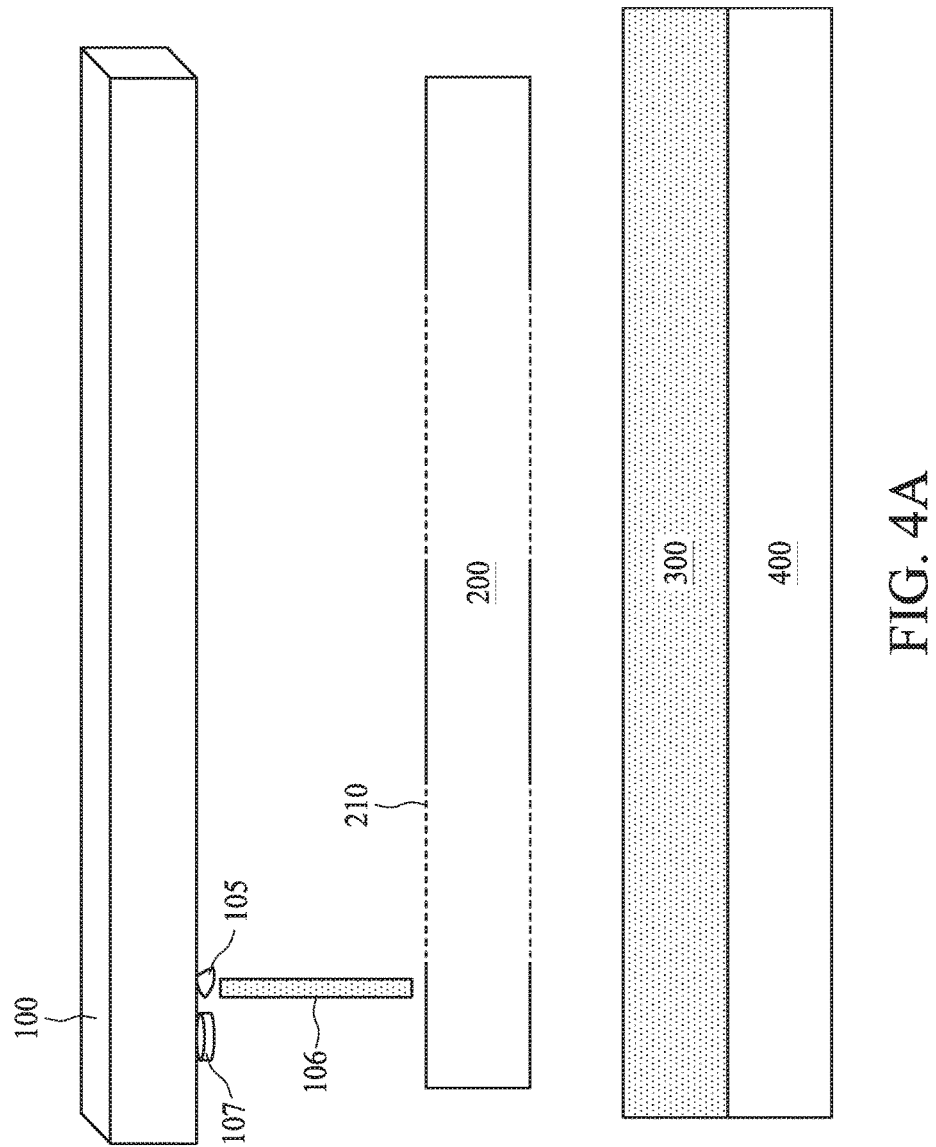
FIG. 4A-4B illustrate a photolithography process.

Light beam emitting can be controlled in various ways. As in FIG. 4A, the light source 100 has a detector 105. The detector 105 emits acoustic wave or optical beam 106 toward the photo mask 200. When the acoustic wave or optical beam 106 reaches the photo mask 200, the detector 105 can recognize the surface condition of the photo mask 200 (for example, through reflected acoustic wave or optical beam) and further identifies where the dotted line region 210 is. The acoustic wave or optical beam 106 used by the detector 105 does not damage or change any property of the photo sensitive layer 300.

Figure 4B:
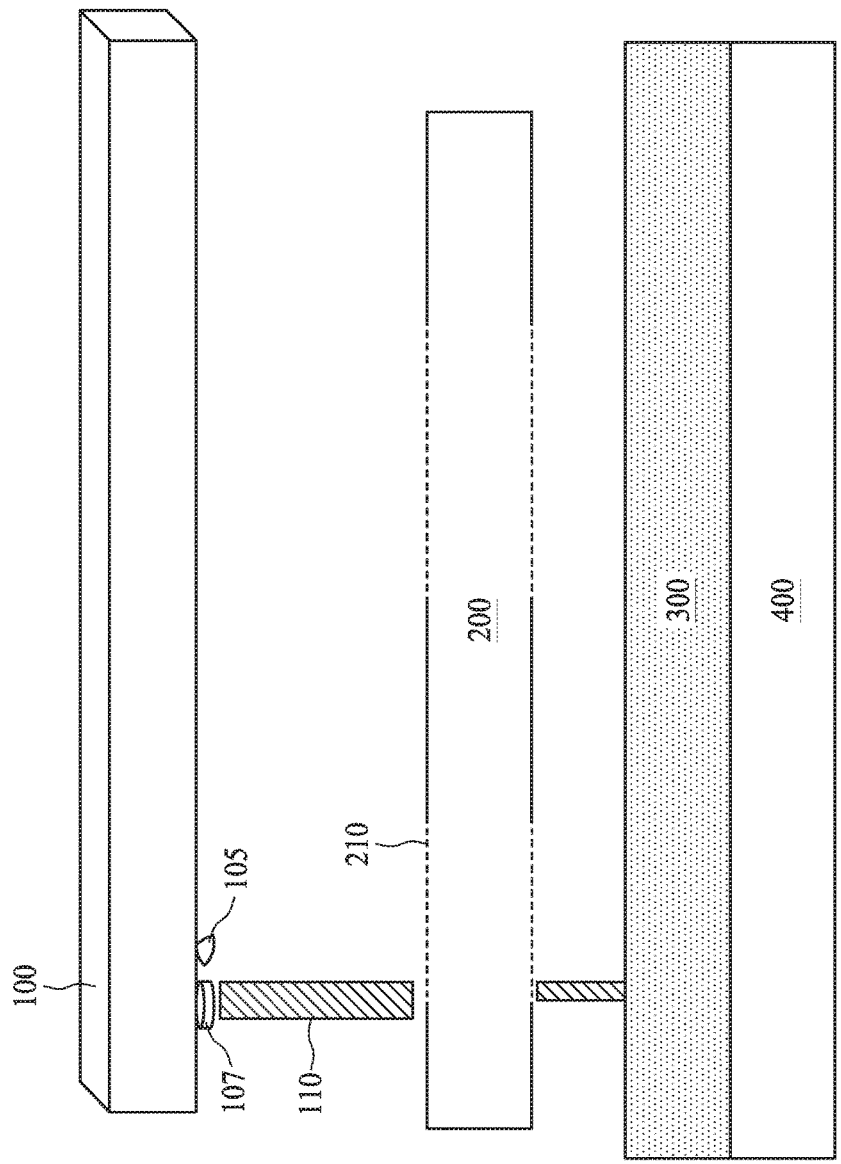

Once the dotted line region 210 is identified, an instruction from a control unit (can be external or embedded in the light source 100) is sent to the light source 100 to determine when and where to emit the light beam 110 through exit 107. As shown in FIG. 4B, when the exit 107 is proximal or over the dotted line region 210, light beam 110 is emitted from the exit 107 and start projecting pattern of the dotted line region 210 to the photo sensitive layer 300.

With the detector 105, the light beam 110 can be selectively turned on and off by the light source 100. For some embodiments, the light beam 110 is only turned on when the exit 107 is over the dotted line region 210. The possibility for the light beam 110 to hit the solid line region of the mask 200 can be reduced.

FIG. 5A-5D illustrate an embodiment performing a multi-layer photolithography operation. In the drawings, there are only two photosensitive layers 300$a$ and 300$b$ stacked over the substrate 400. However, the same concept can apply to more than two photosensitive layers. In some embodiments, photosensitive layers 300$a$ has a highest peak absorption coefficient $\alpha_1$ to a cohesive light beam with a wavelength around $\lambda_1$. Photosensitive layers 300$b$ has a highest peak absorption coefficient $\alpha_2$ to a cohesive light beam with a wavelength around $\lambda_2$.

For mask 200, there are two different dotted regions, 210$a$ and 210$b$. In some embodiments, dotted region 210$a$ is transparent to light beam with a wavelength around $\lambda_1$, and non-transparent to light beam with a wavelength around $\lambda_2$. Dotted region 210$b$ is transparent to light beam with a wavelength around $\lambda_2$, and non-transparent to light beam with a wavelength around $\lambda_1$. In some embodiments, dotted region 210$a$ is transparent to light beam with a wavelength around $\lambda_1$, and also transparent to light beam with a wavelength around $\lambda_2$. Dotted region 210$b$ is transparent to light beam with a wavelength around $\lambda_1$, and also transparent to light beam with a wavelength around $\lambda_2$.

Figure 5A:
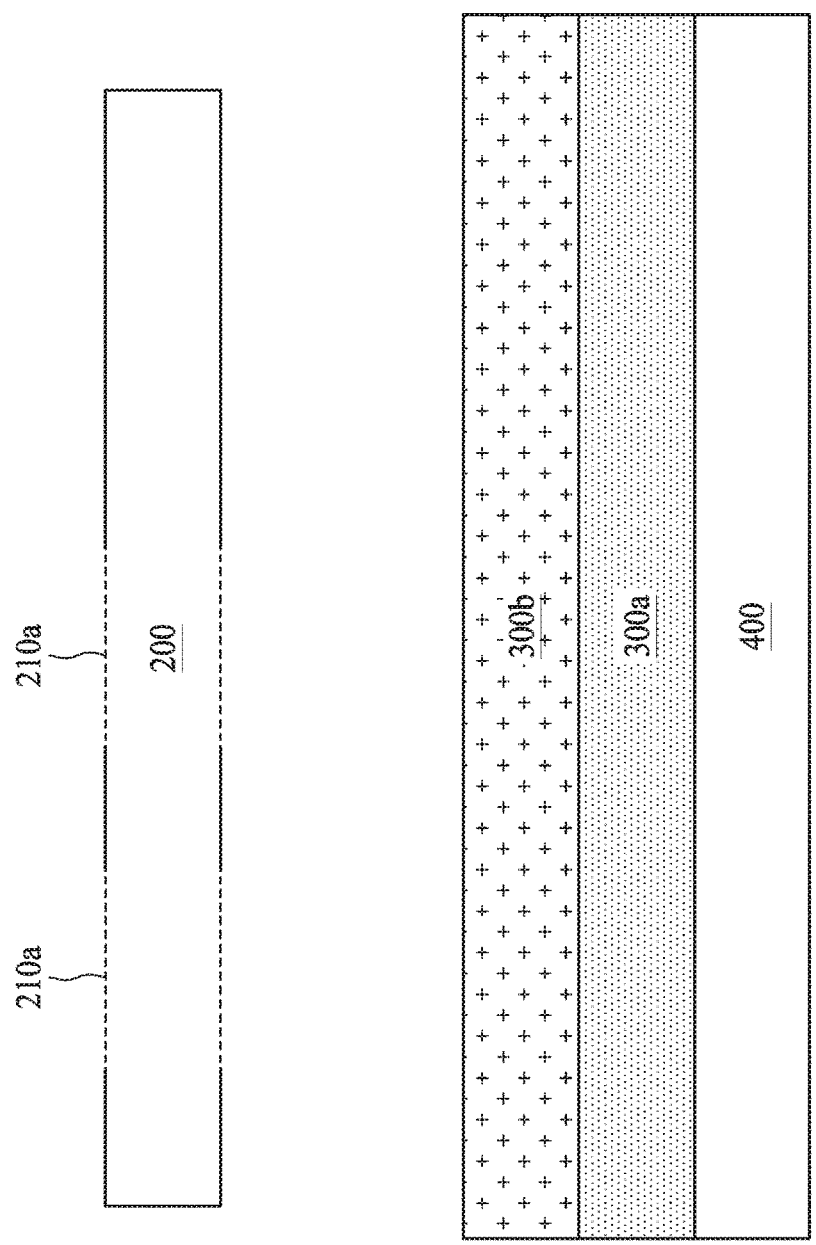
FIG. 5A-5D illustrate a photolithography process.
Figure 5B:
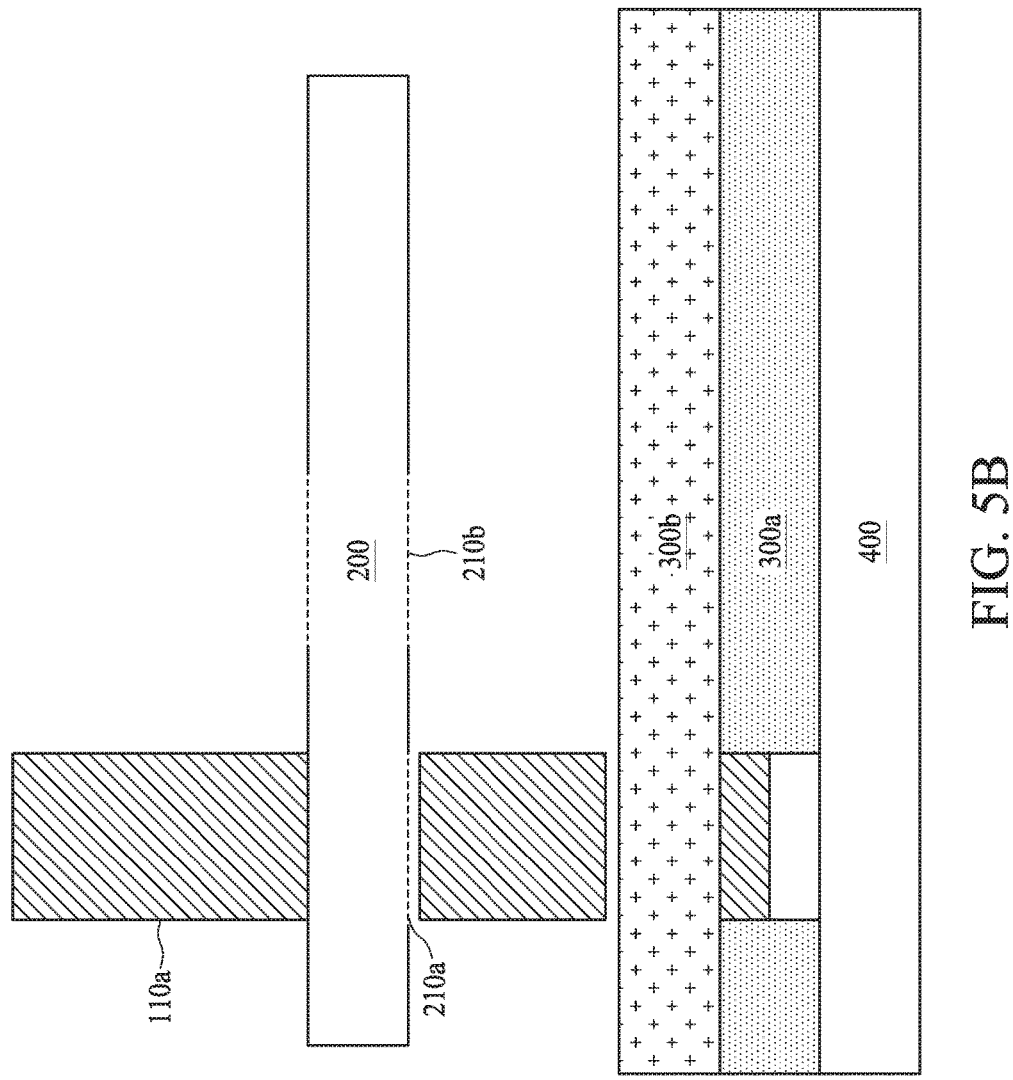

FIG. 5B illustrates a selective photolithography operation with direct carving. Light beam 110$a$ is selected to pass through dotted region 210$a$. Photoresistive layer 300$b$ has a low absorption coefficient $\beta_2$ to light beam 110$a$ in comparison to photoresistive layer 300$a$. In some embodiments, $\beta_2$ is considered as 0 in comparison to $\alpha_1$. In other words, photoresistive layer 300b is transparent to light beam 110a. A hole or recess is formed only in photoresistive layer 300a by light beam 110a.

Figure 5C:
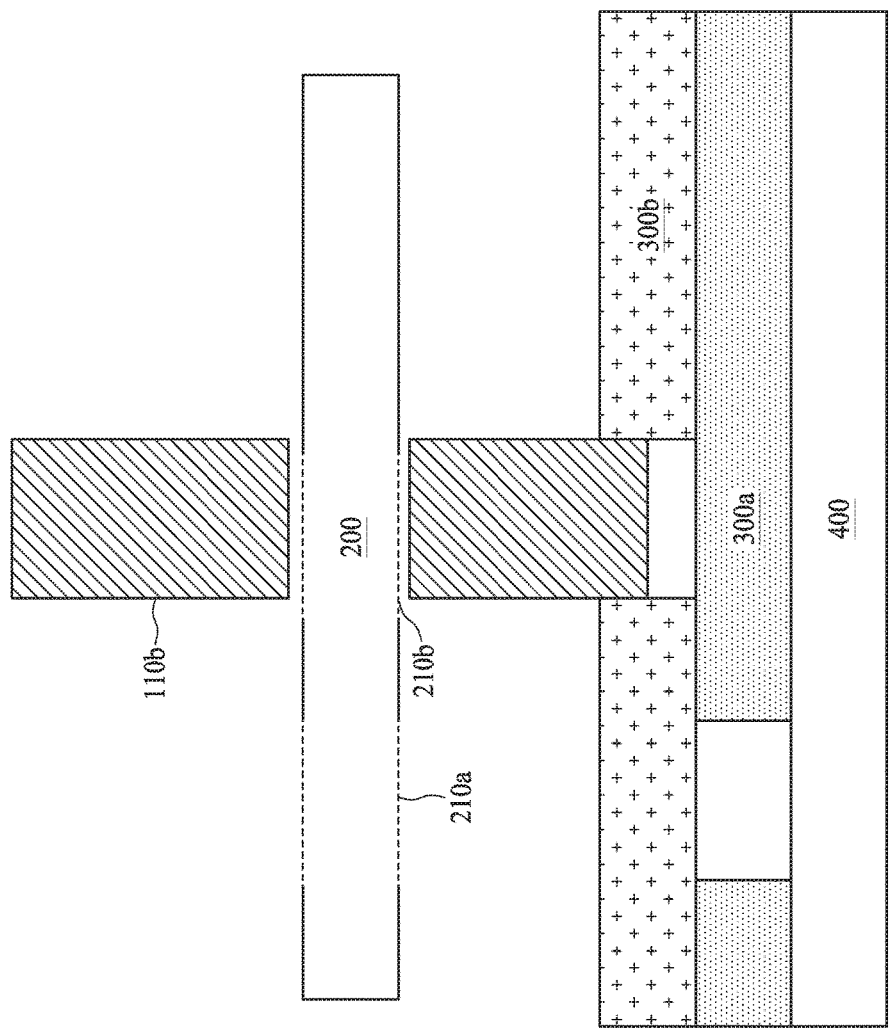

FIG. 5C illustrates another selective photolithography operation with direct carving. Light beam 110b is selected to pass through dotted region, 210b. Photoresistive layer 300a has a low absorption coefficient $\beta_1$ to light beam 110b in comparison to photoresistive layer 300b. In some embodiments, $\beta_1$ is considered as 0 in comparison to $\alpha_2$. In other words, photoresistive layer 300a is transparent to light beam 110b. A hole or recess is formed only in photoresistive layer 300b by light beam 110b.

Figure 5D:
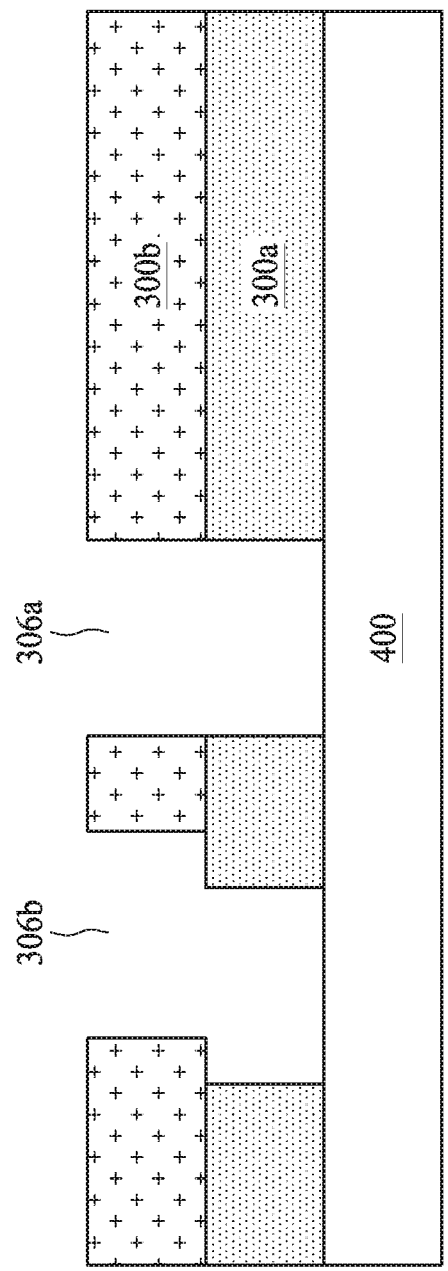

FIG. 5D illustrates another structure after a selective photolithography operation with direct carving. Photoresist layer 300a has several recesses or through holes formed by the selective photolithography operation. Photoresist layer 300b also has several recesses or through holes formed by the selective photolithography operation. Some recesses or holes may align with recesses or holes in photoresist layer 300a may align with recesses or holes in photoresist layer 300b to form a recess or through hole like trench 306a. Some recesses or holes recesses or holes in photoresist layer 300a may be partially overlapped with recesses or holes in photoresist layer 300b to form a recess or through hole like trench 306b.

[Annealing]

Figure 6A:
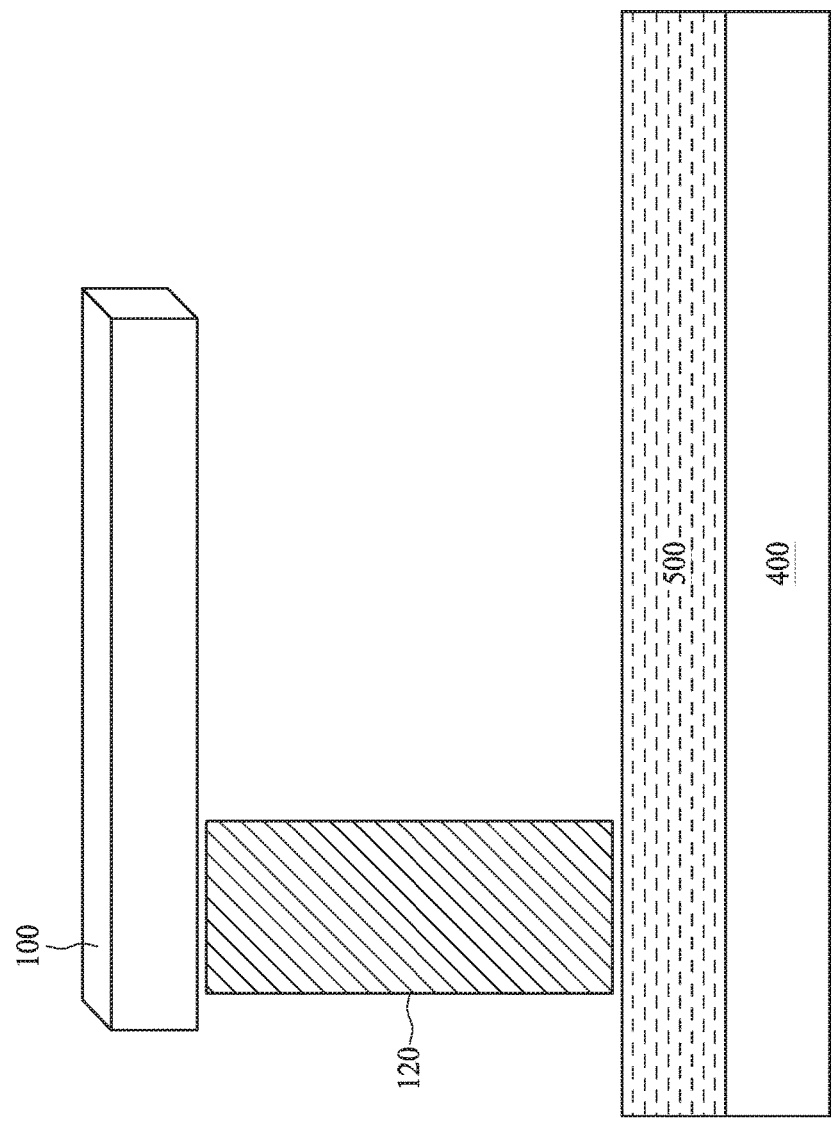

Light source 100 in FIG. 1 can be also adopted in an annealing operation. Similar to the photolithography operations described above, the energy of light beam is used to provide energy to anneal film 500 in FIG. 6A. Light beam 120 is emitted from light source 100 and projected on film 500. Light beam 120 may provide heat to film 500 and change the micro structure or bonding condition inside film 500.

FIG. 6B illustrates a selective annealing operation performed by the light source 100. In some embodiments, regarding to the light beam 120, the thermal absorption coefficient of 500b is almost zero comparing to the thermal absorption coefficient of 500a. Therefore, when light beam 120 is emitted from the light source 100 and toward the substrate 400, film 500b is transparent to the light beam 500b. Energy carried by light beam 120 is absorbed by film 500a. Only film 500a is annealed by the light beam 120.

Figure 6C:
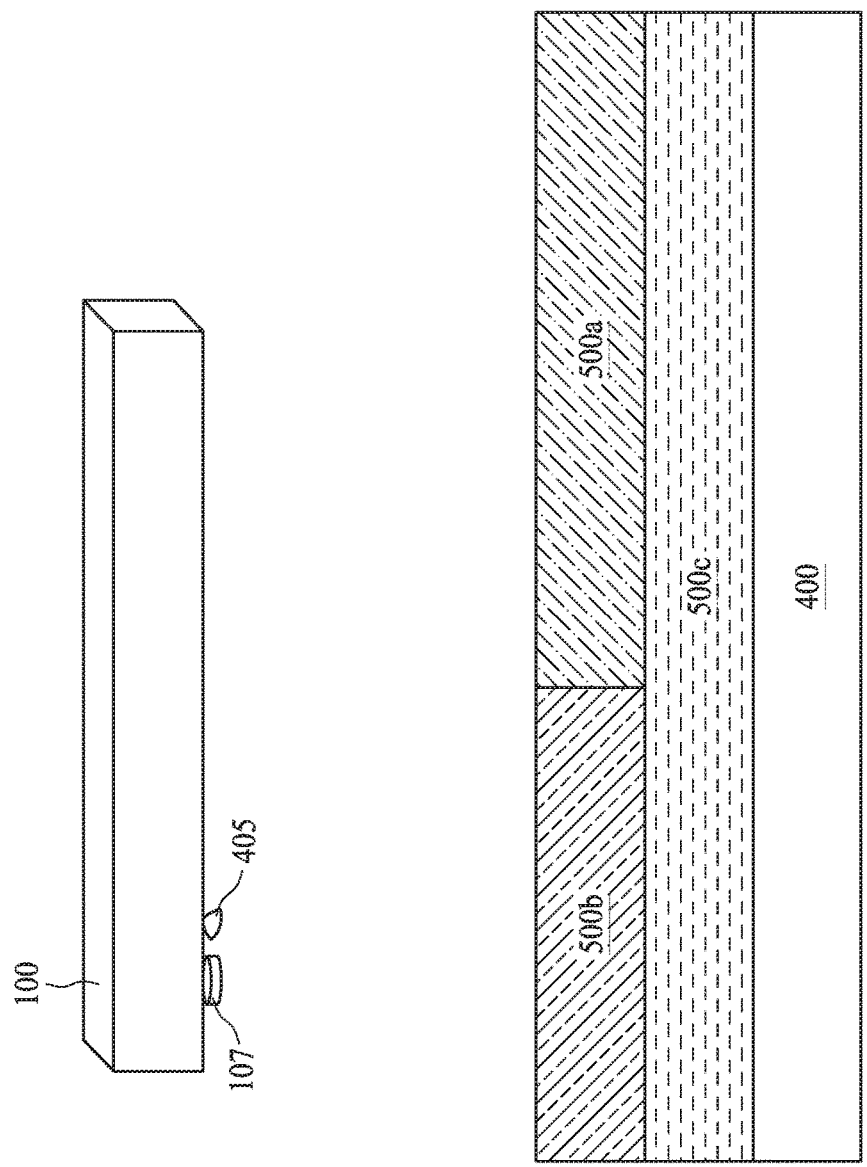

In FIG. 6C, a detector 405 is used to detect the film type. When the light source 100 is moving in relative to the substrate 400. Detector 405 is configured as an inspector for detecting which type the film is. For example, detector 405 can detect there are two different types of films, 500a and 500b, disposed over the substrate 400. The information of film type is sent to a processing unit. The processing unit instructs the light source to emit a light beam with a desired wavelength for selective annealing.

For example, when detector 405 is scanning a top surface of films disposed over substrate 400, information of the areas and locations of film 500a and 500b are generated by the processing unit via the scanning result performed by the detector 405. If only film 500a needs to be annealed, the processing unit sends an instruction to the light source 100 to emit suitable a light beam through exit 107 when the exit 107 passes over the area covered by film 500a.

In some embodiments, when detector 405 is scanning a top surface of films disposed over substrate 400, information of the areas and locations of film 500a and 500b are generated by the processing unit via the scanning result performed by the detector 405. If only film 500a needs to be annealed, the processing unit sends an instruction to the light source 100 to emit a suitable light beam with a first wavelength through exit 107 when the exit 107 passes over the area covered by film 500a. If only film 500b needs to be annealed, the processing unit sends an instruction to the light source 100 to emit a suitable light beam with a first wavelength through exit 107 when the exit 107 passes over the area covered by film 500b.

Figure 6D:
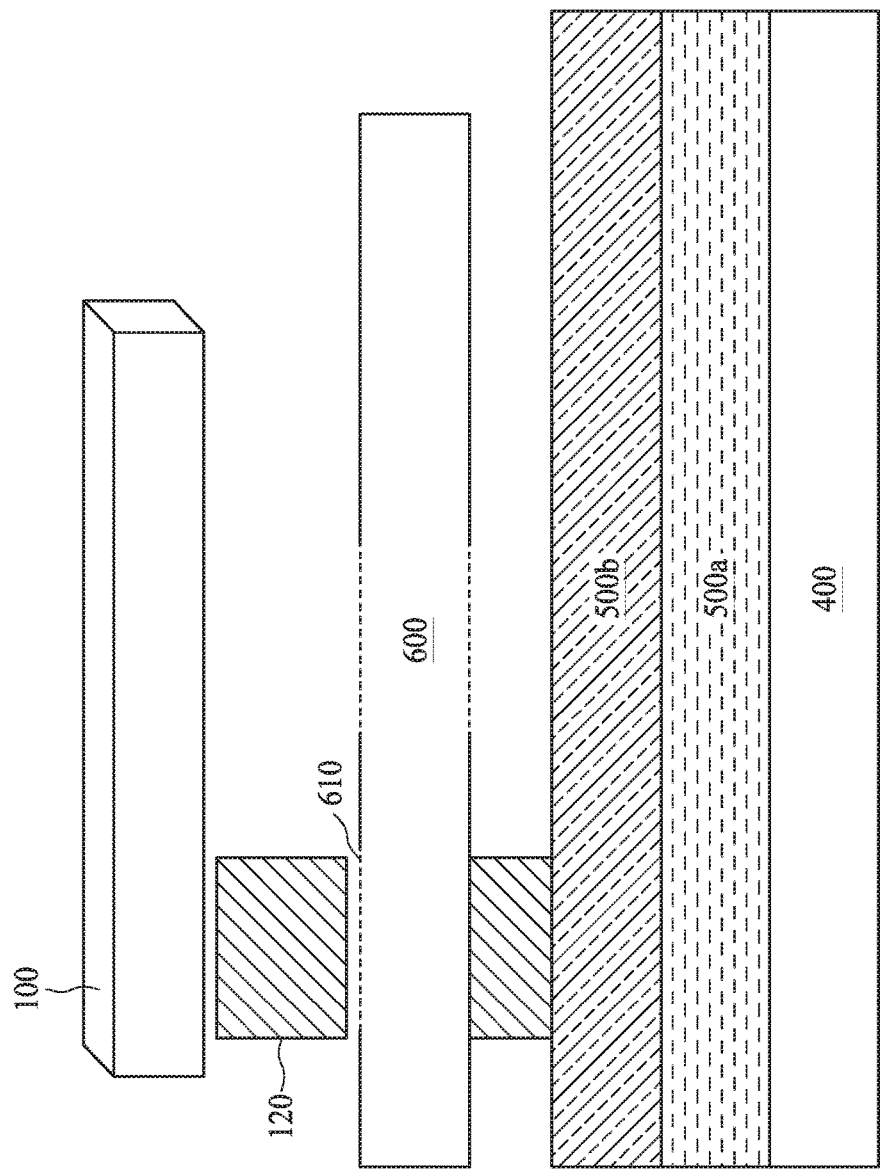

FIG. 6D is a cross sectional view of a photolithography operation according to the present disclosure. A mask 600, similar to the photo mask 200 in FIG. 3A, is adopted for a selective annealing operation. The dotted lines represent regions 610 that are transparent to the light beam 120 and solid lines represent regions that are not transparent to the light beam 120 (i.e. blocking region). In the subject example, the size of the light beam 120 is equal or greater than the size of the dotted line regions. However, this should not be deemed as a limitation.

As in FIG. 6D, a portion of film 500b under the dotted line region 610 is directly annealed by the passing light beam 120. A portion of film 500b under the solid line region is not annealed because the solid line region of mask 600 blocks the light beam 120. In some embodiments, the film is crystallized or re-crystallized by the annealing operation.

[Light Source Configuration]

FIG. 7 illustrates an embodiment of a light source 100 having several exits 107 for emitting light. Light source 100 can emit multiple light beams in a simultaneous manner.

Figure 8B:
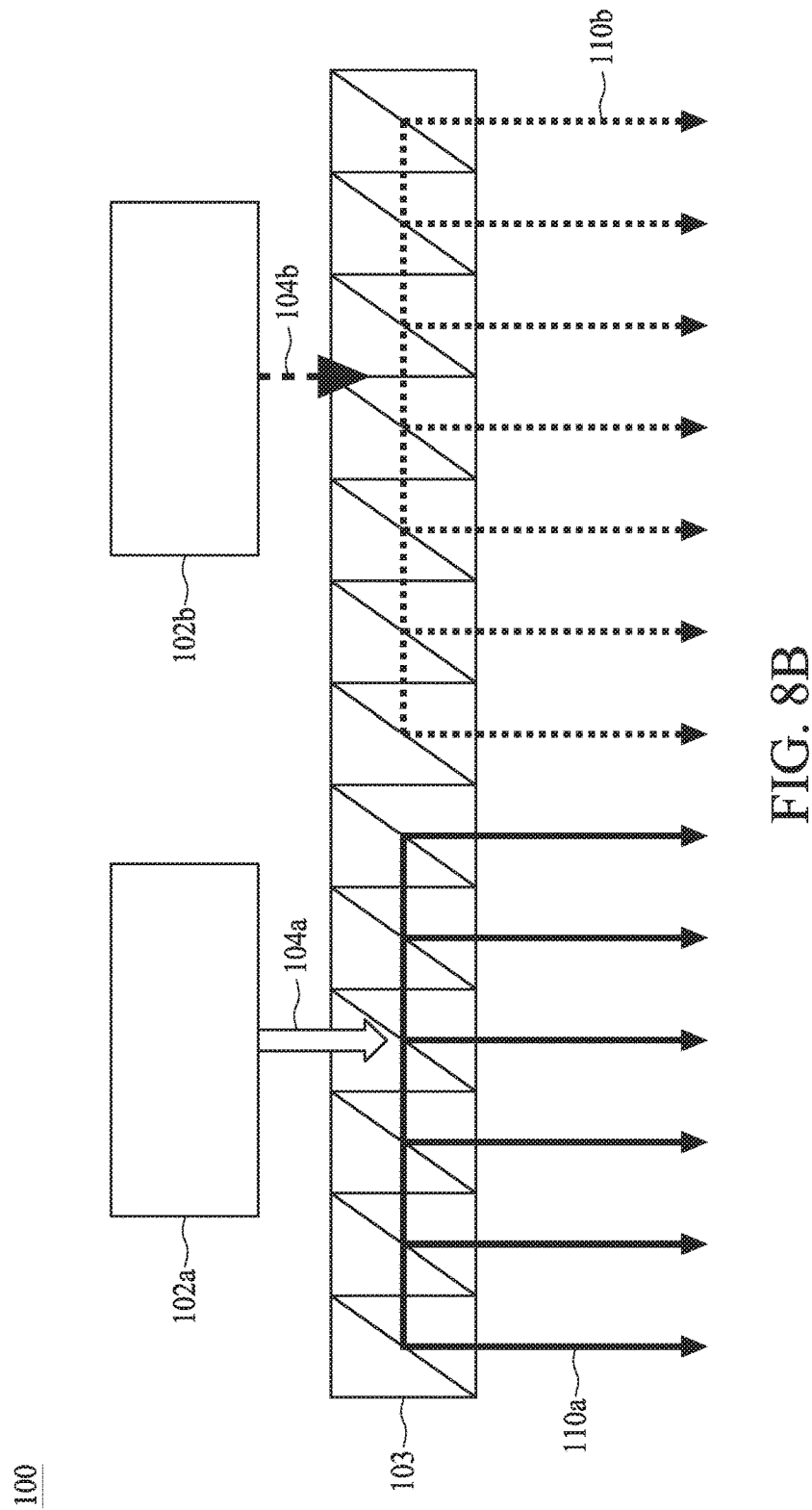

FIG. 8A illustrates an embodiment of a light source 100 configured to emit multiple light beams. The light source has a light generator 102 for generating a light beam 104. The light beam 104 emits into a splitter 103. The splitter 103 can split the light beam 104 into several different light beams 110 in a same direction. In some embodiments, the light beams 110 can be directed to at least two different directions.

In some embodiments, the light source 100 has at least two light generators 104a and 104b. Light generator 104a generates a light beam 110a with a wavelength of $\lambda_1$ and light generator 104b generates a light beam 110b with a wavelength of $\lambda_2$, wherein $\lambda_1$ is different from $\lambda_2$. Light beam 104 a is splitted by the splitter 103 into several light beams 110a with a wavelength of $\lambda_1$. Light beam 104 b is splitted by the splitter 103 into several light beams 110b with a wavelength of $\lambda_2$.

The splitter 103 can be configured to emit the light beam in any pattern as the user desire. For example, in FIG. 8C, the light source 100 has two light generators 104a and 104b. Light generator 104a generates a light beam 110a with a wavelength of $\lambda_1$ and light generator 104b generates a light beam 110b with a wavelength of $\lambda_2$. The splitter 103 can arrange the light emitting two different light beams, 110a and 110b, in an alternating manner. Therefore, a light beam 110a with wavelength of $\lambda_1$ is neighbored with a light beam 110b with wavelength of $\lambda_2$. In some embodiments, the splitter 103 can arrange the splitted emitted lights into a line or a two dimensional (2D) pattern.

Figure 9B:
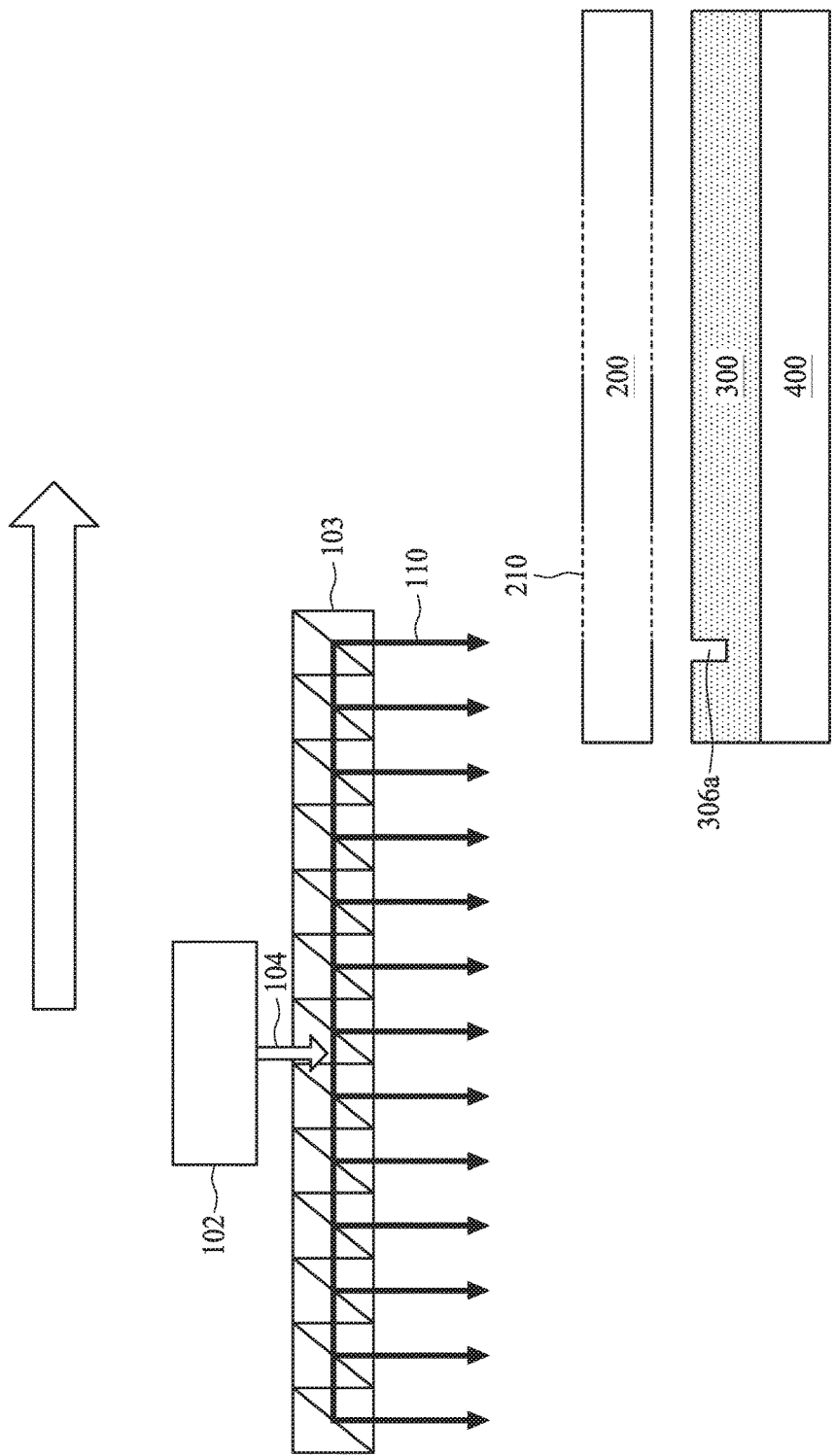

FIG. 9A-9F illustrate an operation of using the multiple light beam to perform photolithography. Direct carving is used for illustration, but same operation can also apply to an indirect carving operation. In FIG. 9A, a multi-beam light source 100 is moving to the right side in relative to the substrate 400. A photosensitive film 300 is over the substrate 400.

In FIG. 9B, when a light beam 110 is over the dotted region 210 of the mask 200, the light beam 110 passed through the mask 200 and provides a first shot to the photosensitive film 300. A recess 306a is formed in the photosensitive film 300. A depth of the recess 306a is shallower than the whole thickness of the photosensitive film 300.

Figure 9C:
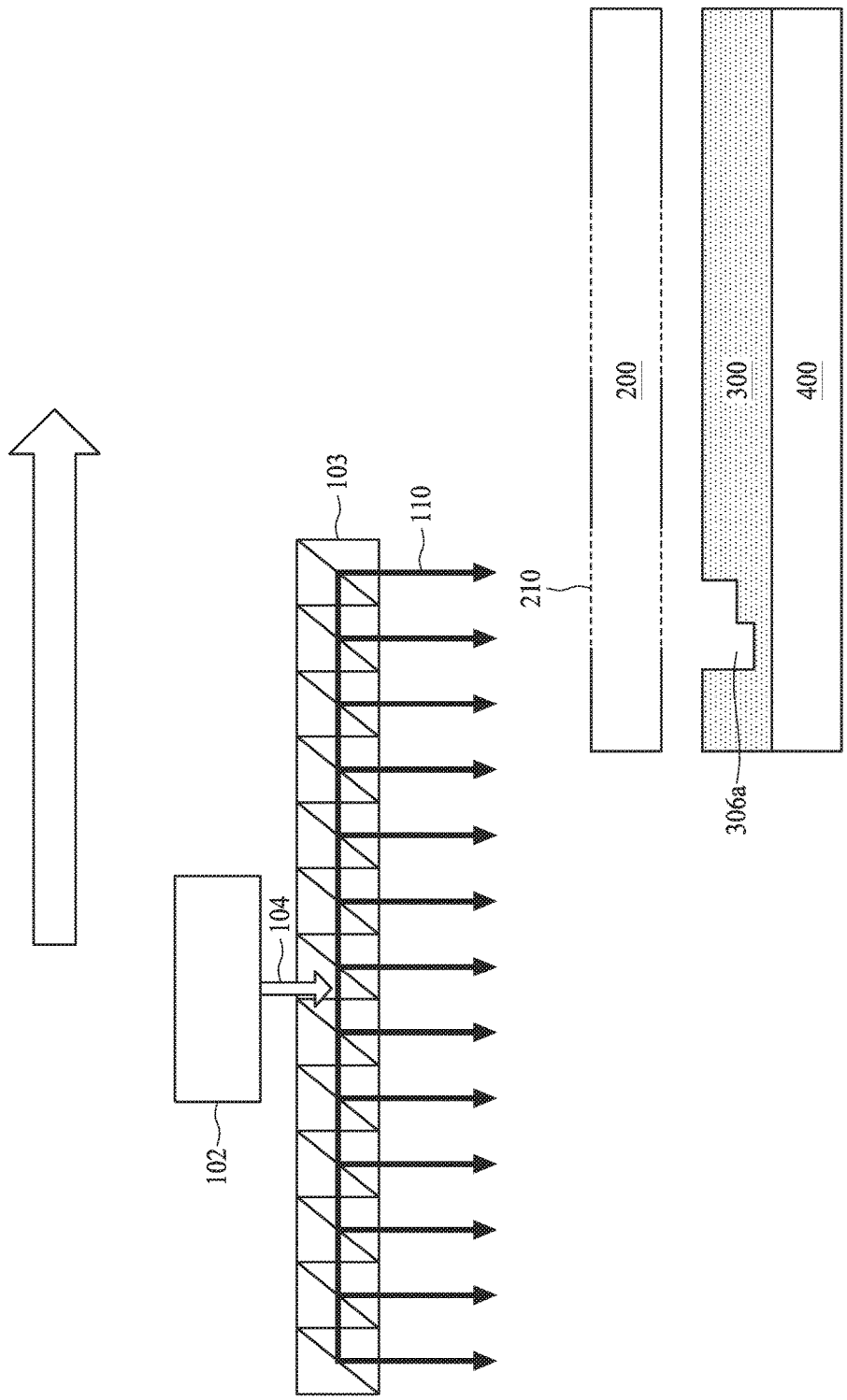

In FIG. 9C, while the light source 100 continues travelling toward right, the photosensitive film 300 receives more and more shots through the dotted region. The recess 306 is enlarged by multiple shots light beam through the dotted region 210. As in FIG. 9C, the bottom of recess 306 may be in a stepped shape. In some embodiments, the bottom surface of recess 306 may be in a curved shape, wherein a greatest depth is on the left side and a smallest depth is on the right side.

Figure 9D:
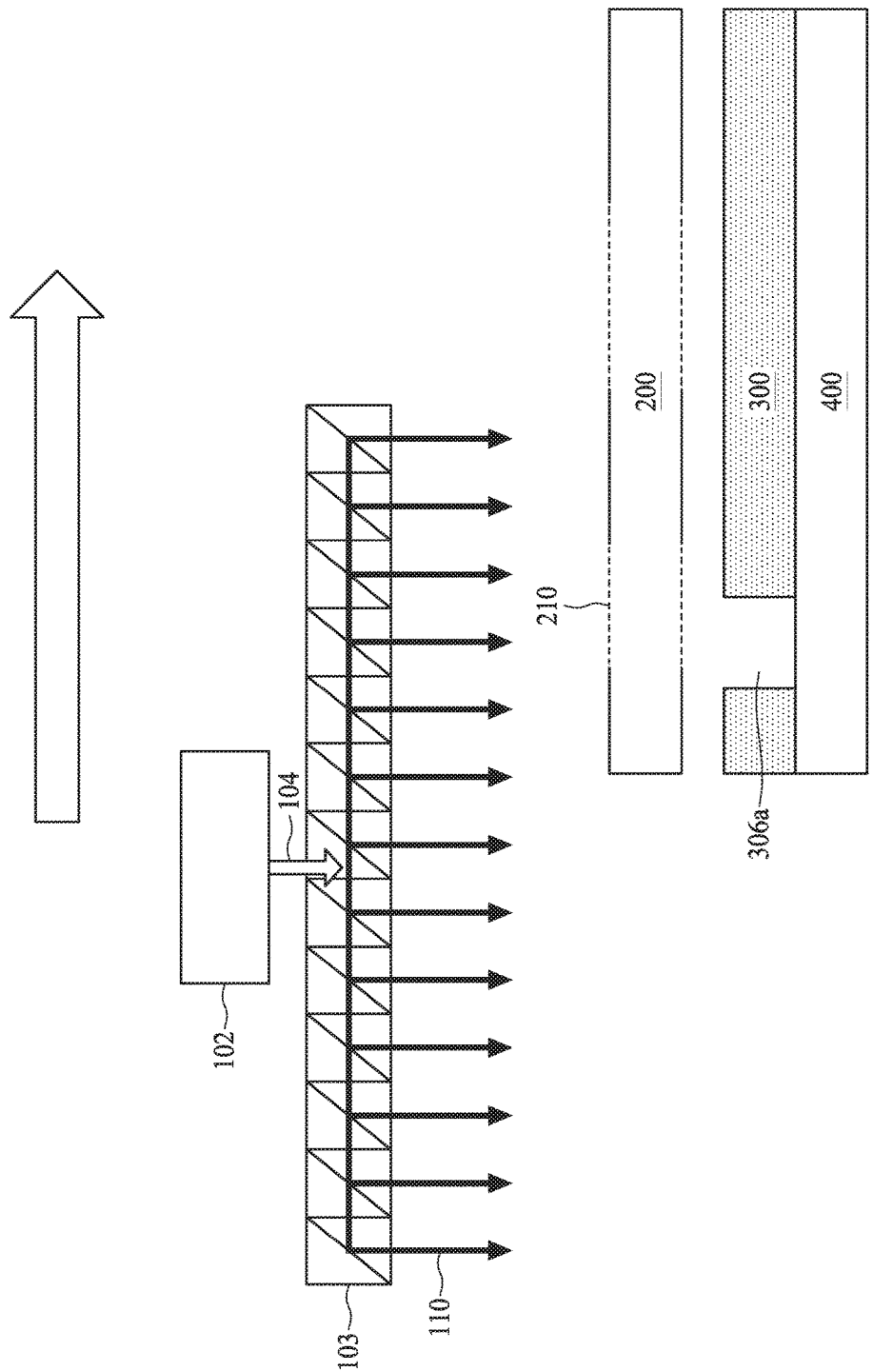

As the operation progresses, the recess 306a is changed to a through hole in the photosensitive film 300 as shown in FIG. 9D. In some embodiments, when the recess 306a becomes a through hole in the photosensitive film 300. A detector as the detector 105 in FIG. 4A can detects the carving operation is completed. The signal will be processed by a processing unit. The processing unit instructs to turn off some of the light beams as in FIG. 9E.

When the light source start approaching next dotted region of the mask 200. Some light beams are turned on again as in FIG. 9F to start a carving operation. Through the multi light beam light source, a multi-shot photolithography operation can be performed. The photolithography is by providing a certain amount of energy dosage to a desired area through a light beam. In some embodiments, a though hole in the photosensitive film 300 is formed by multiple independent light beams and each independent light beam provides the certain amount of energy dosage to the desired area of photosensitive film 300.

In some embodiments, the multi-shot photolithography operation is performed by a light source emitting multiple light beams having at least two different light wavelengths. Therefore, a selective photolithography operation as described in FIG. 5A through FIG. 5D with multi-shot photolithography is performed.

In some embodiments, the multi-shot photolithography operation is performed by a light source emitting multiple light beams having at least two different light wavelengths. Therefore, a selective three dimensional photolithography operation as described in FIG. 5D with multi-shot photolithography is performed.

In some embodiments, the multi-shot annealing operation is performed by a light source emitting multiple light beams having at least two different light wavelengths. Therefore, a selective annealing operation as described in FIG. 6A through FIG. 6D with multi-shot annealing is performed.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

The invention claimed is:

1. A method of forming a device, comprising:
   emitting a coherent light beam;
   providing a mask including a region transparent to the coherent light beam; projecting the coherent light beam on a photosensitive layer through the transparent region of the mask;
   forming a recess in the photosensitive layer by directly carving out the projected portion of the photosensitive layer by the coherent light beam, wherein the recess corresponds to a position of the transparent region of the mask; and
   filling an organic light emitting material in the recess.

2. The method of claim 1, wherein the mask is a 1:1 mask.

3. The method of claim 1, wherein a phase difference within the coherent light beam is less than about 1 m.

4. The method of claim 1, wherein the photosensitive layer is a stack including at least two different types of photo sensitive films.

5. The method of claim 1, wherein projecting the coherent light beam on a photosensitive layer through the transparent region of the mask is dependent on a type of the photosensitive layer.

6. The method of claim 1, wherein emitting a coherent light beam further comprises providing a light source.

7. The method of claim 6, wherein the light source is configured to be able to emit coherent light beams having at least two different wavelengths.

8. The method of claim 1, further comprising scanning the mask prior projecting the coherent light beam on a photosensitive layer through the transparent region of the mask.

9. A method of forming a device, comprising:
   generating a coherent light beam from a light source;
   detecting a type of a first film by the light source; and
   selectively annealing the first film by the coherent light beam in accordance with the type of the film.

10. The method of claim 9, wherein a phase difference within the coherent light beam is less than about 1 m.

11. The method of claim 9, further comprising splitting the coherent light beam into a plurality of light beams prior to selectively annealing the first film.

12. The method of claim 9, further comprising a second film under the first film, wherein the second film is transparent to the coherent light beam.

13. The method of claim 9, further comprising a second film adjacent the first film, wherein the second film is transparent to the coherent light beam.

14. The method of claim 9, further comprising moving the first film in relative to the light source.

* * * * *